United States Patent
Haasmann et al.

(10) Patent No.: US 6,828,406 B2
(45) Date of Patent: Dec. 7, 2004

(54) METHOD OF PRODUCING ORGANIC SEMICONDUCTORS HAVING HIGH CHARGE CARRIER MOBILITY THROUGH π-CONJUGATED CROSSLINKING GROUPS

(75) Inventors: Roland Haasmann, Speichersdorf (DE); Marcus Halik, Erlangen (DE); Günter Schmid, Hemhofen (DE); Andreas Walter, Egloffstein (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,658

(22) Filed: Jul. 1, 2002

(65) Prior Publication Data

US 2003/0027970 A1 Feb. 6, 2003

(30) Foreign Application Priority Data

Jun. 29, 2001 (DE) .......................................... 101 31 669

(51) Int. Cl.[7] .............................................. G08G 61/10
(52) U.S. Cl. ........................ 528/86; 528/373; 528/423; 528/398; 427/581
(58) Field of Search .......................... 528/86, 373, 423, 528/398; 427/581

(56) References Cited

PUBLICATIONS

Published International Application No. 97/10193, filed Mar. 20, 1997.

"Synthesis of Polyphenylenes and Polynapthalenes by Thermolysis of Enedlynes and Dialkynylbenzenes", Jens A. John et al., J. Am. Chem. Soc. 1994, pp. 5011–5012.

*Primary Examiner*—Duc Truong
(74) *Attorney, Agent, or Firm*—Laurence A. Greenberg; Werner H. Stemer; Ralph E. Locher

(57) ABSTRACT

The organic polymers of the invention have electrical semiconductor properties. The compounds have a backbone of phenylene groups to which side groups with semiconductor properties, or which impart semiconductor properties to the polymer, are bonded. The polymers are obtained by Bergmann cyclization from compounds that contain aromatic groups to which vicinal ethynyl groups are bonded. The polymers are suitable for the production of semiconductor components, such as organic transistors or diodes.

10 Claims, No Drawings

METHOD OF PRODUCING ORGANIC SEMICONDUCTORS HAVING HIGH CHARGE CARRIER MOBILITY THROUGH π-CONJUGATED CROSSLINKING GROUPS

BACKGROUND OF THE INVENTION

Field of the Invention

The invention lies in the organic semiconductor technology field. More specifically, the invention relates to an organic polymer having electrical semiconductor properties, compounds from which the polymer can be prepared, a semiconductor component which comprises the organic polymer, and a process for the production of the semiconductor component.

Semiconductor chips are widely used in a variety of technical applications. Their production is still very complicated and expensive. It is true that silicon substrates can be thinned down to very small layer thicknesses so that they become flexible. However, these processes are likewise very expensive, so that flexible or curved microchips are suitable only for demanding applications in which high costs can be accepted. The use of organic semiconductors offers the possibility of economical production of microelectronic semiconductor circuits on flexible substrates. One application is, for example, a thin film comprising integrated control elements for liquid crystal screens. A further application is transponder technology, where information about a product is stored on so-called tags.

Organic semiconductors can be very easily structured, for example by printing processes. However, the use of such organic semiconductors is at present still limited by the low mobility of charge carriers in the organic polymeric semiconductors. This is at present not more than 1–2 cm$^2$/Vs. The maximum operating frequency of transistors, and hence of the electronic circuit, is limited by the mobility of the charge carriers, holes or electrons. It is true that mobilities of the order of magnitude of 10$^{-1}$ cm$^2$/Vs are sufficient for driver applications in the production of TFT active matrix displays. However, the organic semiconductors are not yet suitable for high-frequency applications. For technical reasons, wireless information transmission (RF-ID systems) can be effected only above a certain minimum frequency. In systems which draw their energy directly from the alternating electromagnetic field and hence also have no voltage supply of their own, carrier frequencies of 125 kHz or 13.56 MHz are widely used. Such systems are used, for example, for identifying or labeling articles in smart cards, ident tags or electronic stamps.

Processes in which semiconducting molecules, for example pentacene or oligothiophenes, can be deposited as far as possible in an ordered manner have been developed for improving the charge carrier transport in organic semiconductors. This is possible, for example, by vacuum sublimation. Ordered deposition of the organic semiconductor leads to an increase in the crystallinity of the semiconductor material. As a result of the improved π—π overlap between the molecules or the side chains, the energy barrier for the charge carrier transport can be reduced. By substituting the semiconducting molecular units with bulky groups in the deposition of the organic semiconductor from the liquid or gas phase, it is possible to produce domains which have liquid crystalline properties. Furthermore, synthesis methods in which as high a regioregularity as possible is achieved in the polymers by the use of asymmetric monomers have been developed.

International PCT publication WO 97/10193 describes aromatic compounds substituted by ethynyl groups. These compounds have the following general formula.

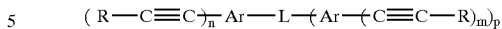

Here, Ar represents an aromatic group which may also be substituted by an inert substituent, R, in each case independently of one another, represent hydrogen or an alkyl or aryl group which in each case may also carry an inert substituent; L denotes a covalent bond or a group which links a group Ar to at least one other group Ar; n and m denote an integer of at least 2; and q denotes an integer of at least 1. The monomer can polymerize with formation of polymers which have high thermal stability. The polymer, which may also be a copolymer, comprises units of the following structure:

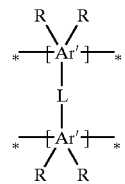

in which the groups Ar' are formed from the (R—C≡C)$_n$Ar and Ar(C≡C—R)$_m$ segments of the above compound by Bergmann cyclization, and the groups R and L have the abovementioned meaning.

In addition to the unit shown above, the copolymer may have units of the following structure:

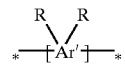

in which Ar' and R have the abovementioned meaning.

Electrically semiconducting polymers are required, for example, in field effect transistors or electronic components which are based on a field effect. A description of such a configuration can be found, for example, in M. G. Kane, J. Campi, M. S. Hammond, F. P. Cuomo, B. Greening, C. D. Sheraw, J. A. Nichols, D. J. Gundlach, J. R. Huang, C. C. Kuo, L. Jia, H. Klauk, T. N. Jackson, IEEE Electron Device Letters, Vol. 21 No. 11 (2000), 534, or D. J. Gundlach, H. Klauk, C. D. Sheraw, C. C. Kuo, J. R. Huan, T. N. Jackson, 1999 International Electron Devices Meeting, December 1999.

For an application of organic polymers in field effect transistors or similar electronic components, it is necessary for the polymer to behave like an insulator when no electric field is applied, while it exhibits semiconductor properties or forms a conduction channel under the influence of an electric field. For example, polyphenylenes or polynaphthalene derivatives have such properties. However, owing to their insolubility, these are not processible, i.e. field effect transistors cannot be produced using these compounds.

The polymers described in WO 97/10193 have insulator properties and can be used, for example, as a dielectric in computer chips. These polymers cannot be used in electronic components, such as, for example, organic field effect transistors, since they acquire electrical semiconductor properties only as a result of doping. Doping is unspecific, which is why a field effect transistor produced from this polymer can no longer be switched off.

SUMMARY OF THE INVENTION

It is accordingly an object of the invention to provide a method for the production of organic polymers with high charge carrier mobility due to π-conjugated crosslinking groups, which overcomes the above-mentioned disadvantages of the heretofore-known devices and methods of this general type and which are suitable for the production of organic field effect transistors.

With the foregoing and other objects in view there is provided, in accordance with the invention, an organic polymer which has electrical semiconductor properties and has a backbone of phenylene groups and a structure of the formula I Formula I

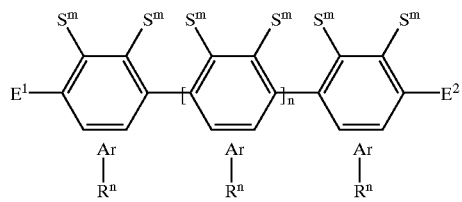

in which

E$^1$ and E$^2$ each represent any desired terminal group or a free electron;

S$^m$ represents a group which is electrically semiconducting or which produces electrical semiconductor properties in the polymer, it being possible for the groups S$^m$ in the polymer to be identical or different;

Ar represents a fused-on aromatic or heteroaromatic radical which shares a carbon bond with the phenylene groups of the backbone of the polymer;

R$^n$ represents any desired radical by which Ar can be substituted, it also being possible for a plurality of radicals R$^n$, which may be identical or different, to be bonded to Ar, and it also being possible for the radicals R$^n$ to be bonded to one another with the formation of a conjugated π system; and n represents an integer from 1 to 10$^6$.

In the polymers according to the invention, groups which already have semiconductor properties or which impart semiconductor properties to the polymers are arranged in the polymer skeleton in a certain spatial arrangement relative to one another. The polymer skeleton is composed of conjugated π bonds. This gives rise to a conduction path in the backbone of the polymer which is formed by phenylene groups, along which path charge carriers are transported. The charge transport in the polymer according to the invention is shown in the following formula II.

Formula II

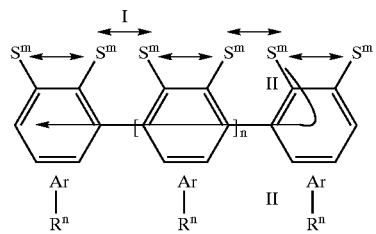

On the one hand, the charge carriers can move from one group S$^m$ to the next group S$^m$ by a hopping mechanism as in the case of the materials described above, such as, for example, pentacene (path I in formula II). The charge transport is effected here so to speak "intermolecularly", i.e. not along chemical bonds. The energy barrier which has to be overcome for charge transport by the hopping mechanism is relatively high. However, the average energy barrier of the hopping mechanism is considerably reduced by the large conjugation length of the polymer, i.e. by the arrangement of the side chains S$^m$ in the polymer.

In addition to this intermolecular charge carrier transport between the side groups S$^m$, there is in the polymer according to the invention also a second path along which charge carriers can be transported. Here, the charge transport takes place along the chemical bonds over the conjugated π system (path II in formula II). As a result, the mobility of the charge carriers increases considerably in comparison with the organic semiconductor materials known from the prior art. A further advantage is that amorphous regions too have high charge carrier mobility. The polymer therefore need not have high crystallinity, as is required, for example, in the case of pentacene.

In an arrangement corresponding to a field effect transistor and without application of a corresponding electric field, the compounds behave like insulators. After application of a corresponding electric field, a charge channel is formed. The polymers according to the invention are therefore very suitable for the production of organic field effect transistors.

The organic polymers according to the invention can be used both as p-semiconductors and as n-semiconductors. Whether the polymer according to the invention is a p-semiconductor or an n-semiconductor is determined by the relevant position of HOMO and LUMO.

Side groups S$^m$ used may be groups which are already electrically semiconducting in the form of the free compound. However, the groups may also be chosen so that they impart semiconductor properties to the polymers. The polymer according to the invention is derived from polyphenylene which has the desired electrical semiconductor properties. These semiconductor properties can be influenced by the side groups S$^m$. To this extent, the structure of the side groups S$^m$ can be varied within wide limits. If compounds which themselves already have semiconductor properties are used as side groups S$^m$, a further charge carrier channel based on the hopping mechanism described above is opened up.

In each case aromatic or heteroaromatic radicals Ar are fused onto the chain of phenylene groups which form the backbone of the polymer. This means that the radicals Ar share a carbon bond with the phenylene group of the polymer backbone and thus form a common π-electron system. Radicals R$^n$ in turn are bonded to the aromatic or heteroaromatic radicals Ar. The radicals R$^n$ are not subject to any particular restrictions per se. One or more radicals R$^n$, which may be identical or different, can be bonded to Ar. The radicals R$^n$ are preferably formed so that they extend the π-electron system which is formed by the phenylene groups of the polymer backbone and the radicals Ar fused thereon. The radicals R$^n$ may also be linked to one another, here too a conjugated π-electron system preferably being formed. The polymer skeleton thus acquires higher stability, which further reduces the energy content of the π-electron system. The mobility of the charge carriers thus further increases. Furthermore, it is known that in particular compounds which have an extensive π-electron system and additionally an ordering π—π overlap in the field body exhibit a field effect. The compounds are therefore suitable in particular for use in field effect transistors.

The length and the molecular weight of the polymer may be influenced by the reaction conditions which are chosen for its preparation. Depending on the chain length of the polymer, n represents an integer from 1 to 106.

Aromatic groups Ar are fused onto the polymer backbone formed from the phenylene groups. Said groups Ar are preferably 5- or 6-membered rings which may also comprise one or more hetero atoms. Preferably, Ar is selected from the group consisting of

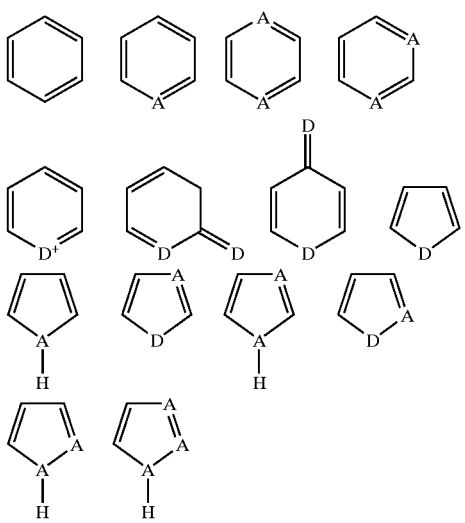

in each case two neighboring carbon atoms in the ring forming the linkage point for the condensation with the phenylene groups in the polymer backbone, and A represents N, P, As or Sb; and D represents O, S, Se or Te.

Among the radicals shown above, the phenyl radical is particularly preferred. This radical gives a polymer of the formula III:

Formula III

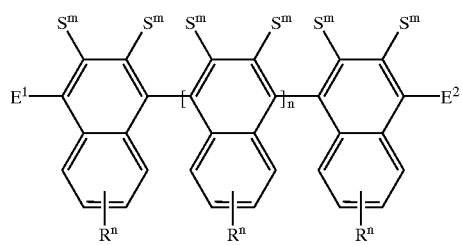

The radicals $S^m$, $E^1$, $E^2$ and $R^n$ and n have the above-mentioned meaning. The fused-on phenyl groups may be substituted by one or more radicals $R^n$. The radicals $R^n$ may also be linked to one another by chemical bonds, a π-electron system preferably being formed. The radicals $R^n$ may also be further fused-on aromatic or heteroaromatic rings.

If the fused-on radical Ar comprises a hetero atom, this is preferably selected from N, O and S. The 6-membered rings are preferred in the case of the heteroaromatic groups Ar.

The radical $R^n$ is not subject to any particular restrictions per se. For example, the electronic properties of the polymer can be influenced by the radicals $R^n$. Preferably, $R^n$ represents a monovalent radical selected from the group consisting of H, F, Cl, Br, alkyl groups having 1 to 10 carbon atoms, cycloalkyl groups having 5 to 20 carbon atoms, aryl groups having 6 to 20 carbon atoms, in which up to four carbon atoms may also be replaced by N,

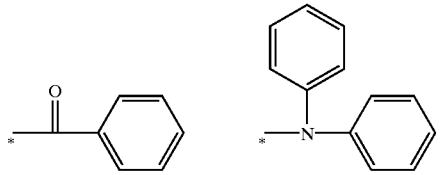

-continued

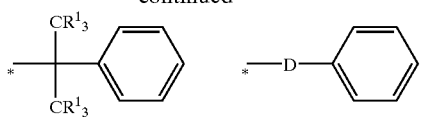

$R^1$ representing H, F, Cl or Br;

D being as defined in claim 2; and

* designating the linkage point to Ar or a further radical;

it being possible for these groups also to be linked to Ar via an ethynyl group;

or represents a fused-on radical which is selected from the group consisting of

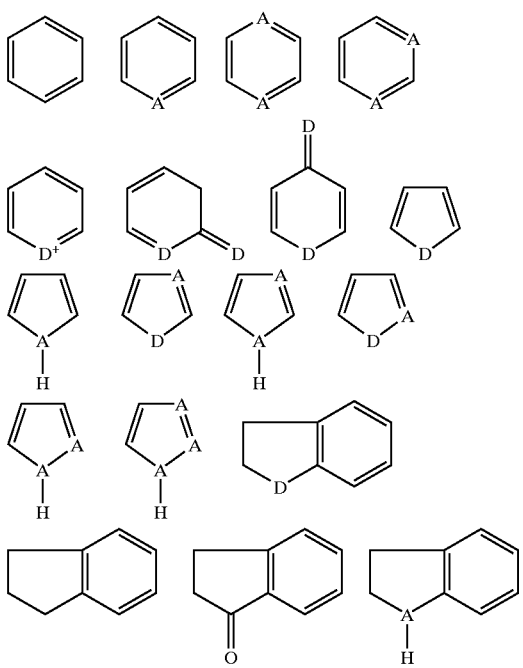

which in turn may be fused to one another with formation of a polycyclic π-system, A and D having the meanings stated in claim 2 and the linkage to Ar taking place via neighboring carbon atoms.

Preferably an extensive π system is formed by the radicals $R^n$ in the polymer. The radicals $R^n$ present in the molecule may be identical to or different from one another.

Preferably, the compound of the formula I comprises only one backbone formed from phenylene groups, the phenylene groups in each case forming a bond to a neighboring phenylene group in the para-position relative to one another. However, linkage of the radicals $R^n$ can also take place in principle in a manner such that the polymer comprises, for example, a further backbone formed from phenylene groups. This can be formed, for example, from ethynyl groups by Bergmann cyclization. The radicals $R^n$ then also comprise groups $S^m$. In contrast to the polymer described in WO 97/10193, the polymers have semiconductor properties, i.e. they differ in the side groups $S^m$ which substantially determine the electrical semiconductor properties of the molecules.

As an example of an embodiment of the polymer, formula IV shows a polymer in which the radical Ar is in the form of a phenyl group and one of the radicals $R^n$ is in the form of an indanyl radical. One or more radicals $R''$ may in turn be substituted on the indanyl radical, it being possible for the radicals $R''$ to have the abovementioned meanings and to be identical or different.

Formula IV

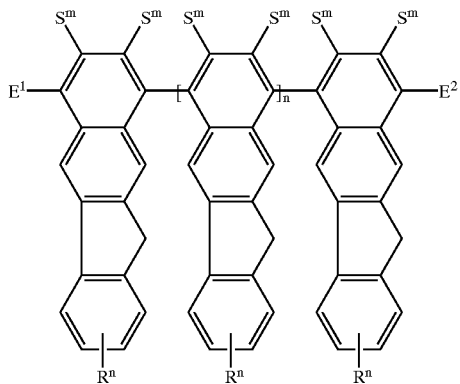

If $R''$ is in the form of an aromatic or heteroaromatic radical, the linkage can be effected via a single bond or by condensation via a common carbon bond.

An example in which the radicals $R''$ form a further backbone of phenylene groups with crosslinking is shown as formula V.

Formula V

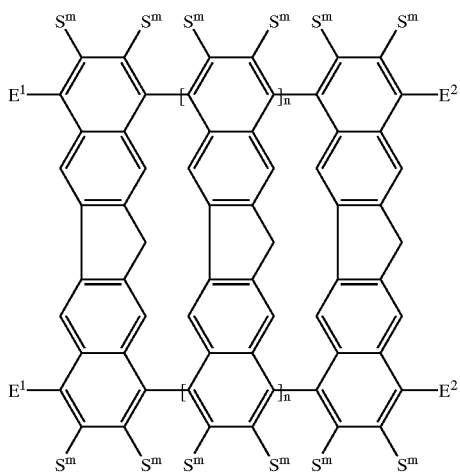

Groups which are obtained by linking a radical $R''$ to a phenyl ring which forms the radical Ar of the molecule are shown below.

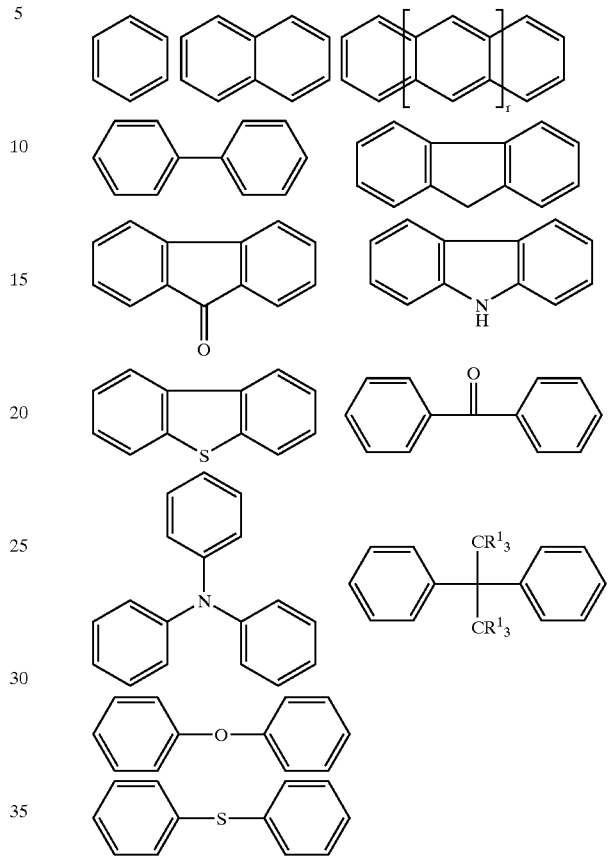

it being possible for r to be an integer from 1 to 10 and $R^1$ having the abovementioned meaning. These groups can themselves also act as radicals $R''$, it being possible for the bonding to be effected via a single bond or by condensation of a phenyl ring with a neighboring aromatic ring.

The particular properties of the polymer are produced by the side group $S^m$. This either itself has semiconductor properties or it imparts semiconductor properties to the polymer or modifies its semiconductor properties. The side group $S^m$ is preferably selected from the group consisting of

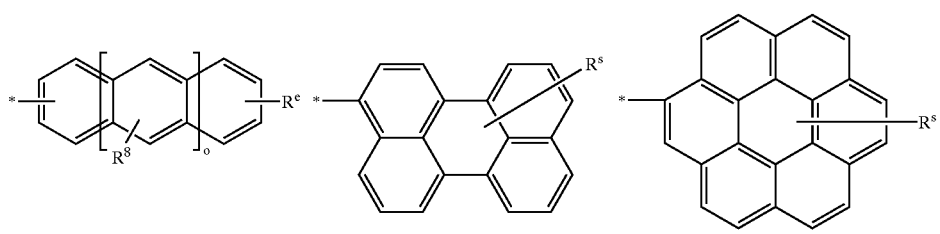

-continued
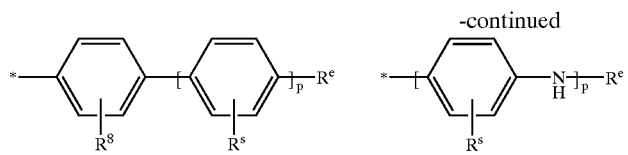
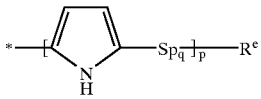
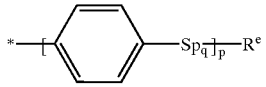
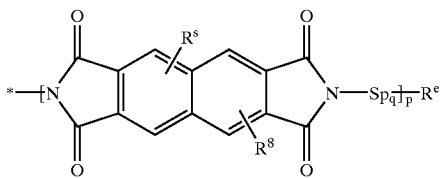
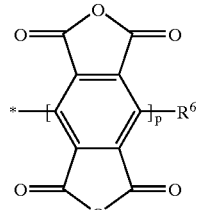
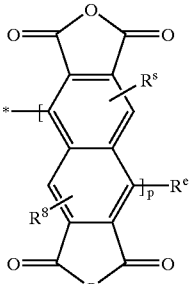
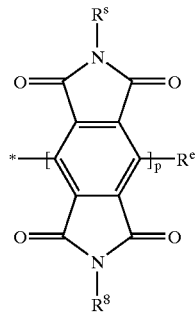
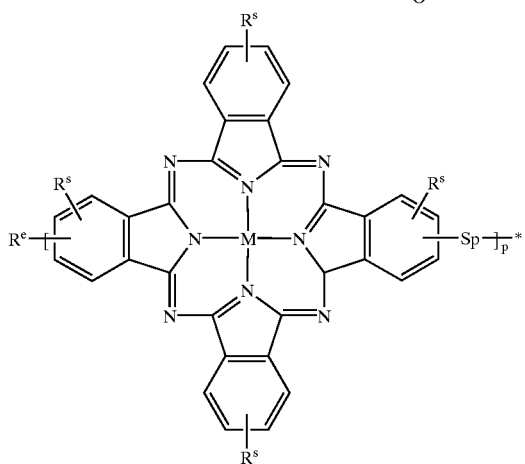
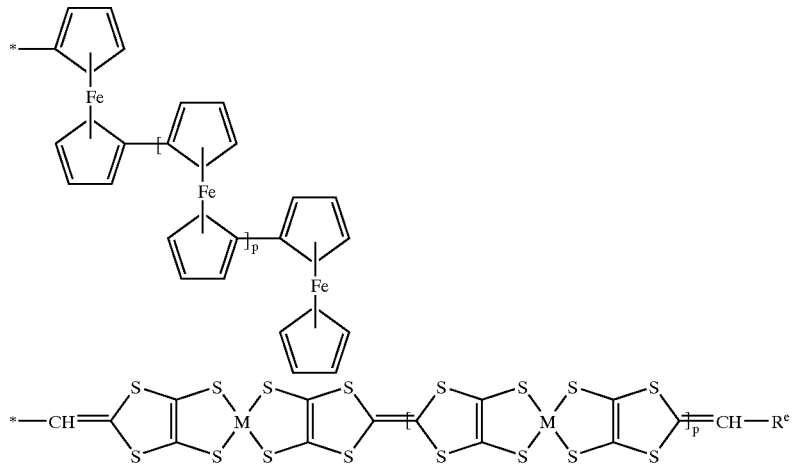
wherein
M represents a divalent metal,
o represents an integer from 0 to 6,
p denotes an integer from 1 to 20,
q represents 0 or 1;
Sp represents a π-conjugated spacer,
$R^3$ represents H or an alkyl group having 1 to 10 carbon atoms;

$R^e$ represents a terminal substituent which may be H or $R^s$;

it being possible for one or more of the hydrogen atoms of $S^m$ to be substituted by $R^s$; and $R^s$ represents $-OR^3$, $-C(O)R^3$, $-C(O)OR^3$, $-NR^3_2$, $-SR^3$, $-SO_3R^3$, $-PO_4R^3$, $-PR^3_2$, $-CN$, $-OCN$, $-NO_2$, $-(PPh_2Ru(CO)(C_5H_5))$, and an alkyl group having 1 to 10 carbon atoms, which may also be completely or partly fluorinated, a cycloalkyl group having 5 to 20 carbon atoms, an aryl group having 6 to 20 carbon atoms, a heteroaryl group having 3 to 20 carbon atoms and 1 to 4 hetero atoms which are selected from the group consisting of O, S and N, it being possible for the alkyl, the cycloalkyl, the aryl or the heteroaryl groups to be bonded via a single bond, an ethynyl group, $-O-$, $-NH-$ or $-S-$ to $S^m$ and furthermore for the cycloalkyl, the aryl and the heteroaryl groups to be fused with $S^m$ via a common pair of carbon atoms.

In the case of the porphyrin system, M may also denote an empty site.

A π-conjugated spacer is understood as meaning a system which has an arrangement of conjugated single and multiple bonds, for example a chain of phenylene rings bonded via a single bond or in particular a polyalkenylene chain of the following structure:

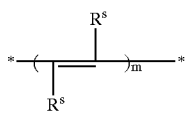

in which $R^s$ has the abovementioned meaning and m is an integer from 1 to 10.

The groups $S^m$ may be bonded covalently or by a coordinate bond, for example via a metal atom, to the polymer backbone formed from phenylene groups. Preferably, the side group $S^m$ consists of polycondensed phenyl rings.

The electrically semiconducting polymer according to the invention can be synthesized by Bergmann cyclization. In the synthesis, compounds of the formula VI

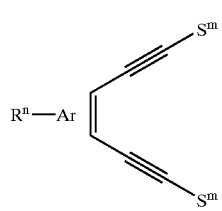

Formula VI in which $R^n$, Ar and $S^m$ have the meanings stated in claims 1 to 4 and the radicals $S^m$ may be identical or different, are used as starting materials.

The compounds of the formula VI are characterized by the vicinal arrangement of the ethynyl groups on the aromatic or heteroaromatic group Ar. The ethynyl groups each carry radicals $S^m$ which produce or modify the electrical semiconductor properties of the polymer produced from these compounds. The compounds each contain at least one pair of such vicinally arranged ethynyl groups. However, it is also possible for a plurality of pairs of such ethynyl groups to be present in the molecule. An example of such a molecule is shown below, the group Ar being formed by a phenyl ring and the radical $R^n$ by a phenyl group. It is also possible for a plurality of groups Ar which in each case contain at least one pair of ethynyl groups with a group $S^m$ to be present in the compound. Corresponding examples are shown below as formulae VIIa and VIIb.

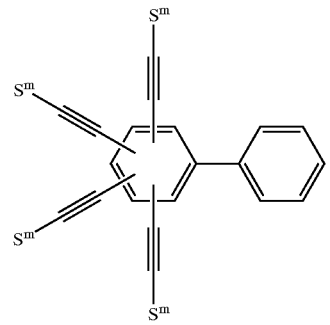

VIIa

VIIb

Various isomers are possible, the ethynyl groups being arranged vicinally in pairs.

The polymerization of the monomers is effected by Bergmann cyclization. The enediyne system of the monomers initially undergoes cyclization under the action of, for example, light and forms a reactive intermediate which comprises two unpaired electrons. The intermediate then polymerizes with formation of the polymer according to the invention. The mechanism is shown schematically below.

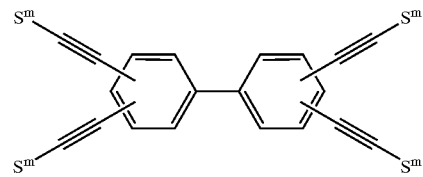

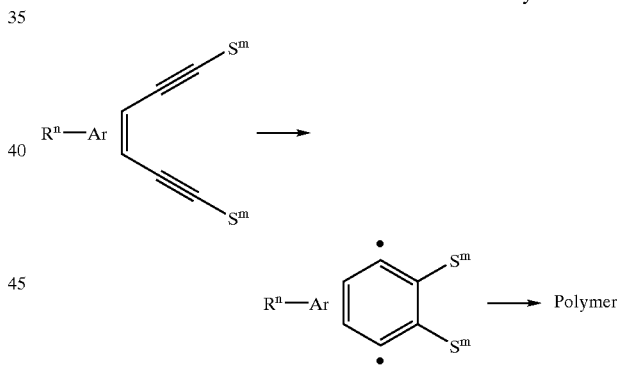

The invention furthermore relates to a semiconductor component. This comprises an organic polymer having electrical semiconductor properties, as has been described above. The semiconductor component may be designed in a variety of ways, for example in the form of transistors or diodes. An arrangement as an organic field effect transistor is preferred. The semiconductor component according to the invention is preferably applied to a flexible substrate. Economical, flexible, transparent polymer films based on polyethylene naphthalate, polyethylene terephthalate, polyethylene, polypropylene, polystyrene, epoxy resin, polyimide, polybenzoxazole, polyether or the electrically conductive coated variants thereof are preferably used for this purpose. Furthermore, flexible metal foils, glass, quartz or glasses having an electrically conductive coating can also be used as the substrate.

For the production of such semiconductor components, according to the invention a polymer as described above is applied to a substrate and is structured. Structuring of the polymer can be effected, for example, by first producing a film of the polymers according to the invention and then structuring this by conventional photolithographic methods. The polymer film can be produced, for example, by spin-coating. Advantageously, however, the polymer can also be applied to the surface of the substrate by a printing process. Suitable printing processes are, for example, inkjet, tampon and screen printing. The polymer can also be adapted to offset processes through the choice of the substituents.

However, the monomers described above are preferably first applied to the substrate. The monomers can be dissolved in a suitable solvent and can therefore be applied to a substrate without difficulties. For example, the methods described above can be used for applying the solution. Polymerization to give the polymer according to the invention is then effected. The polymer is generally insoluble and is therefore relatively insensitive to further removal, for example by solvents or abrasion. The polymerization of the monomers is effected, for example, by exposing the substrate on whose surface the monomer has been applied to light. Another possibility arises if the monomers are present as solids. These can then also be processed to give toners for laser printing. The polymerization step is then effected during the baking process of laser printing on the substrate.

If the monomer is applied in dissolved form to the substrate, for example in inkjet printing or in spin-coating, the viscosity of the solution can be increased by first carrying out a prepolymerization. The monomers then form oligomers, with the result that the viscosity of the solution increases. The viscosity of the solution can thus be adapted to the respective method.

If the monomer or oligomer is applied in the form of a solution to the substrate, the solvent is removed in a bake step prior to the polymerization step. For this purpose, the substrate is heated, preferably to a temperature of less than 100° C. The polymerization with formation of a π-conjugated crosslinked semiconductor material takes place in a subsequent heating phase. The heating is generally carried out at temperatures of from 50 to 300° C. Owing to the thermal stability of the compound described, however, temperatures of less than 150° C. are preferably used. The polymerization step can be supported by photocrosslinking.

Solvents used for the monomers or the prepolymerized oligomers may be, for example, alkanes, such as pentane, hexane and heptane, or aromatic compounds, such as benzene, toluene or dixylenes. Furthermore, alcohols, such as methanol, ethanol and propanol, and also ketones, such as acetone, ethyl methyl ketone and cyclohexanone, are also suitable. Esters suitable as solvents are, for example, ethyl acetate and ethyl lactate. Lactones, such as γ-butyrolactone or N-methylpyrrolidone, are also suitable. Halogenated solvents, such as methylene chloride, chloroform or carbon tetrachloride or chlorobenzene, may also be used. Of course, mixtures of these solvents can also be used.

The polymer layer can be doped with conventional dopants, such as, for example, Na, K, Cs, $I_2$, $FeCl_3$ or $AsCl_5$, for increasing the conductivity.

EXAMPLE

The invention is illustrated in more detail with reference to an example.

Synthesis of o-bis-2'-(α-terthienyl)ethynylbenzene o-Bis-2'-(α-terthienyl)ethynylbenzene is obtained by transition metal-catalyzed coupling with the use of o-diethynylbenzene and α-terthienyl bromide.

o-Diethynylbenzene was prepared from o-diiodobenzene and trimethylsilylacetylene with subsequent basic desilylation.

α-Terthienyl bromide was prepared by bromination of α-terthiophene at one end.

α-Terthiophene in turn was obtained from a Friedel-Crafts acylation of succinyl chloride with thiophene, followed by aromatic ring closure by thionylation with phosphorus(IV) sulfide.

A solution of 0.23 g of o-diethynylbenzene (1.82 mmol) in 10 ml of tetrahydrofuran (THF) and 2 ml of triethylamine is added dropwise to a solution of 1.17 g (3.5 mmol) of α-terthienyl bromide in 40 ml of dry THF with 16 mg of palladium(II) acetate, 40 mg of triphenyphosphine as reducing agent and 27 mg of copper(I) iodide in an argon atmosphere at room temperature. Stirring is then carried out for a further 24 h at room temperature. The course of the reaction is observed by thin-layer chromatography (3:1 petroleum ether/dichloromethane).

After the end of the reaction, the reaction mixture is purified by column chromatography (4:1 petroleum ether/dichloromethane). Yield: 0.44 g of yellow solid (39%);

$^1$H-NMR (CDCl$_3$; ppm): 6.99 (d; 1H), 7.04 (d; 1H), 7.07 (d; 1H) 7.09 (dd; 1H), 7.14 (d; 1H), 7.20 (dd; 1H), 7.23 (dd; 1H), 7.29 (dd; 2H), 7.51 (dd; 2H)

$^{13}$C-NMR (CDCl$_3$, ppm): 139.03; 138.69; 136.95; 136.88; 135.87; 135.75; 135.42; 133.62; 133.08; 132.85; 131.32; 130.75; 128.93; 128.52; 128.14; 127.93; 126.79; 125.23; 124.86; 124.72; 124.43; 123.93; 123.80; 123.70; 123.49; 121.85; 106.97; 93.31; 87.17; 77.60.

MS (FAB):m/z=618

IR:ν (cm$^{-1}$): 3468.3; 3064.0; 2921.4; 2190.4; 1700.2; 1635.5; 1506.3; 1496.4; 1452.2; 1419.5; 1384.3; 1219.7; 1195.7; 1118.6; 968.9; 944.4; 862.2; 834.6; 789.3; 753.8; 698.2; 618.1; 517.6; 469.8; 457.7.

We claim:

1. An organic polymer with electrical semiconductor properties, comprising a backbone of phenylene groups and having a structure of the following formula

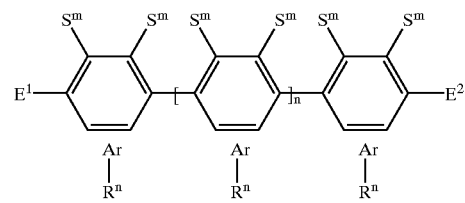

wherein $E^1$ and $E^2$ each represents any desired terminal group or a free electron;

$S^m$ represents a group which is electrically semiconducting or which produces electrical semiconductor properties in the polymer, wherein the groups $S^m$ in the polymer may be identical or different;

$S^m$ being selected from the group consisting of

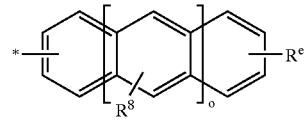

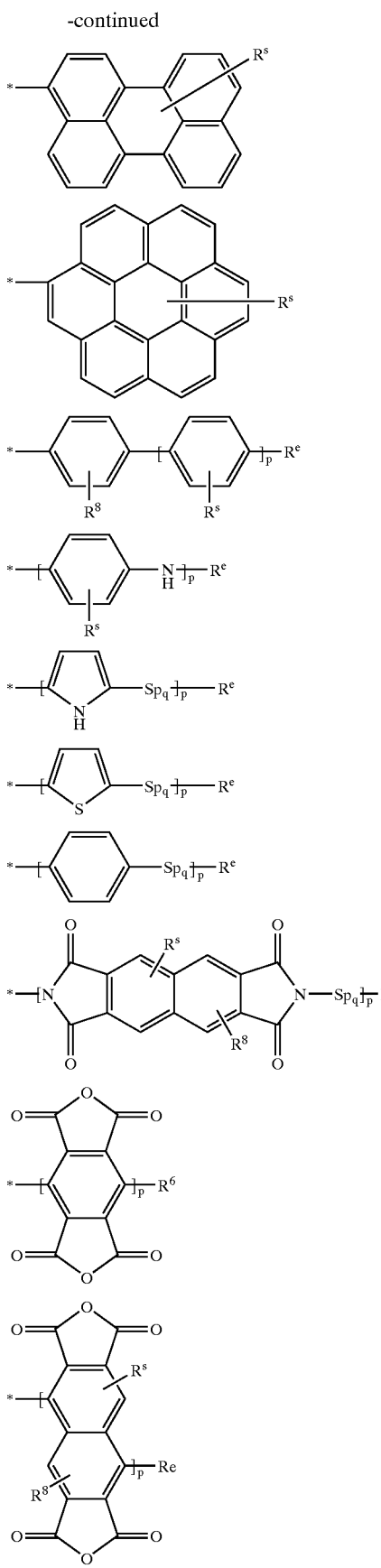
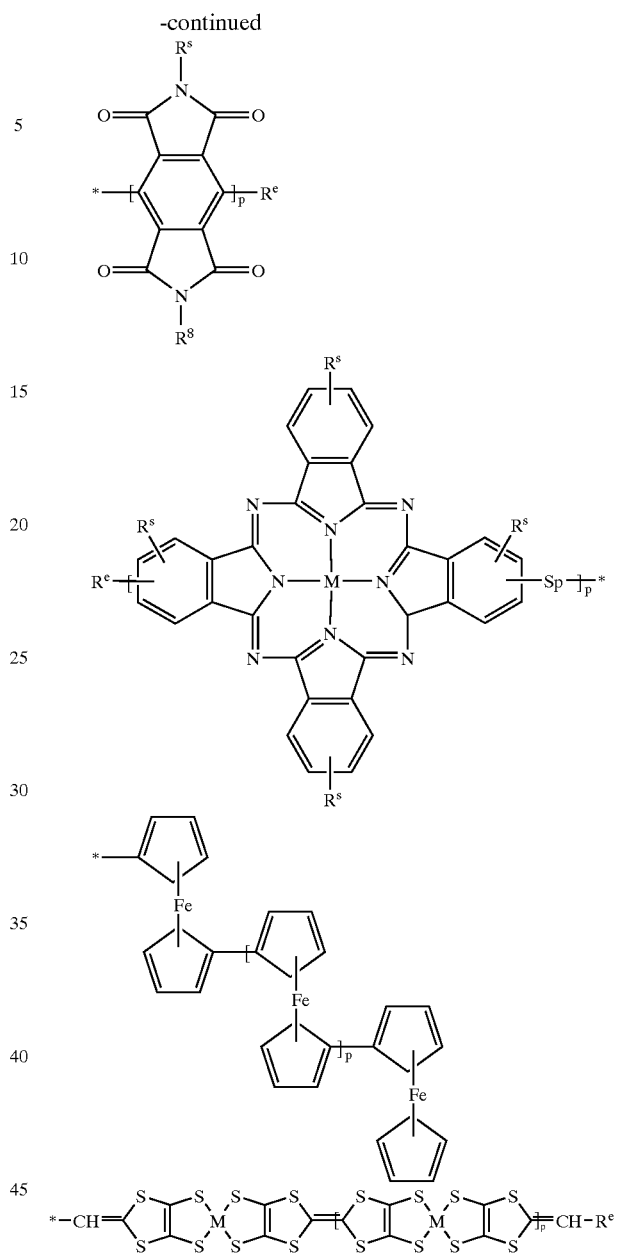

M representing a divalent metal;
o representing an integer from 0 to 6;
p denoting an integer from 1 to 20;
q representing 0 or 1;
Sp representing a π-conjugated spacer;
$R^3$ representing H or an alkyl group having 1 to 10 carbon atoms;
$R^e$ representing a terminal substituent which may be H or $R^s$;
one or more of the hydrogen atoms of $S^m$ being substitutable by $R^s$; and
$R^s$ representing —$OR^3$, —$C(O)R^3$, —$C(O)OR^3$, —$NR^3{}_2$, —$SR^3$, —$SO_3R^3$, —$PO_4R^3$, —$PR^3{}_2$, —CN, —OCN, —NCO, —$NO_2$, —$(PPh_2Ru(CO)(C_5H_5))$, and an alkyl group having 1 to 10 carbon atoms, a cycloalkyl group having 5 to 20 carbon atoms, an aryl group having 6 to 20 carbon atoms, a heteroaryl group having 3 to 20 carbon atoms and 1 to 4 hetero atoms which are selected from the group consisting of O, S, and N, wherein these groups may be bonded via a single bond, an ethynyl group, —O—, —NH— or —S— to $S^m$, and the cycloalkyl, the aryl and the heteroaryl groups may be fused with $S^m$ via a common pair of carbon atoms;

Ar represents a fused-on aromatic or heteroaromatic radical that shares a carbon bond with the phenylene groups of the backbone of the polymer and thus forms with them a common π-electron system;

Ar being selected from the group consisting of

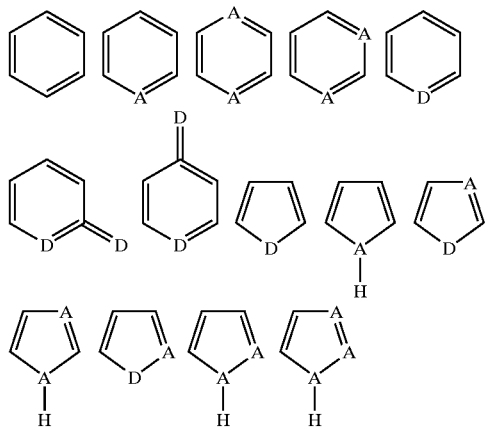

wherein in each case two neighboring carbon atoms form a linkage point for the condensation with the phenylene groups in the polymer backbone;

A representing N, P, As, or Sb; and

D representing O, S, Se, or Te;

$R^n$ represents any desired radical by which Ar can be substituted;

wherein a plurality of radicals $R^n$, which may be identical or different, may be bonded to Ar, and the radicals $R^n$ may be bonded to one another under formation of a conjugated π system; and n represents an integer from 1 to $10^6$;

$R^n$ represents a monovalent radical selected from the group consisting of H, F, Cl, Br, alkyl groups having 1 to 10 carbon atoms, cycloalkyl groups having 5 to 20 carbon atoms, aryl groups having 6 to 20 carbon atoms, in which up to four carbon atoms may be replaced by N,

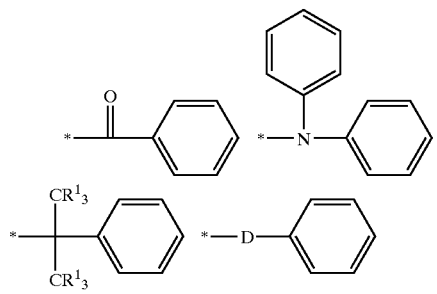

where $R^1$ represents H, F, Cl, or Br;

D represents O, S, Se, or Te; and

* designates a linkage point to Ar or a further radical; and wherein these groups may be also be linked to Ar by an ethynyl group;

or representing a fused-on radical selected from the group consisting of

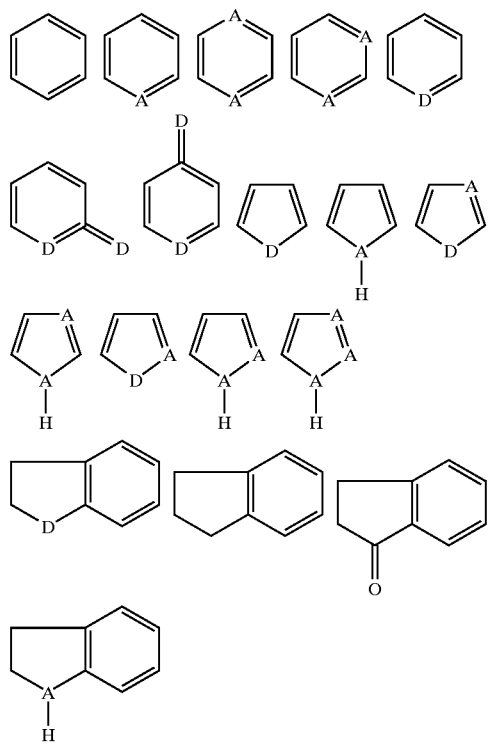

which in turn may be fused to one another with formation of a polycyclic π-system; and wherein A represents N, P, As, or Sb, D represents O, S, Se, or Te, and the linkage to Ar is effected via neighboring carbon atoms such that an extensive π system is formed; and when Ar is selected to be phenyl and $S^m$ is selected to be

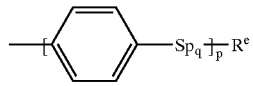

q is 1;

p is from 1 to 20; and $R^e$ represents a terminal substituent that may be H or $R^s$.

2. The polymer according to claim 1, wherein the alkyl group in Rs is completely or partly fluorinated.

3. A compound having the following formula:

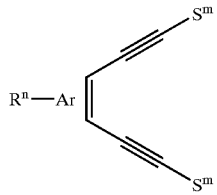

wherein $S^m$ each represents radical which is electrically semiconducting or which produces electrical semiconductor properties;

Ar represents a fused-on aromatic or heteroaromatic radical;

R'' represents any desired radical by which Ar can be substituted; and the two radicals $S^m$ may be identical or different.

4. A method of producing a semiconductor component, which comprises applying a polymer according to claim 1 to a substrate and structuring the polymer.

5. A method of producing a semiconductor component, which comprises applying a compound of the formula according to claim 3 to a substrate, polymerizing the compound on the substrate, and subsequently structuring the resulting polymer.

6. The method according to claim 5, which comprises exposing the substrate with the compound applied thereon to light for polymerizing the compound.

7. The method according to claim 5, which comprises preparing a solution of the compound according to claim 3 and prepolymerizing the compound until a viscosity of the solution has been increased to such an extent that the solution can be applied to the substrate by a process selected from the group consisting of printing and spin-coating.

8. A semiconductor component, comprising an organic polymer having electrical semiconductor properties according to claim 1.

9. The semiconductor component according to claim 8 formed as an organic field effect transistor.

10. The compound according to claim 3, wherein $S^m$ is selected from the group consisting of

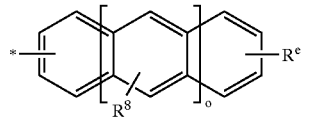
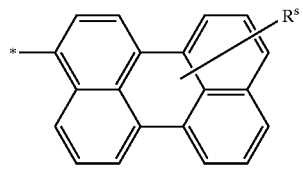
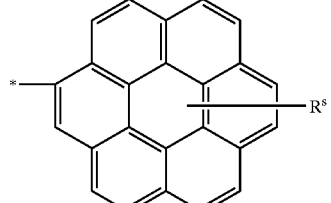
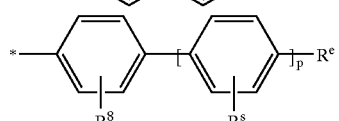
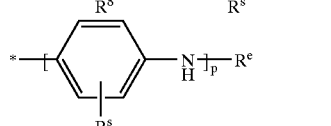
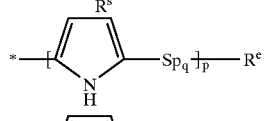
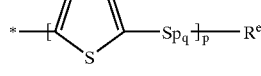

-continued

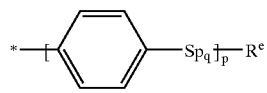
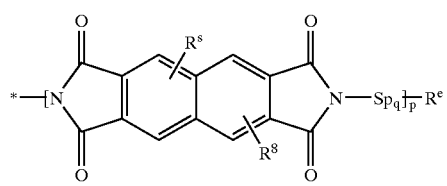
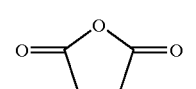
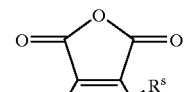
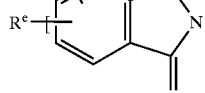

-continued

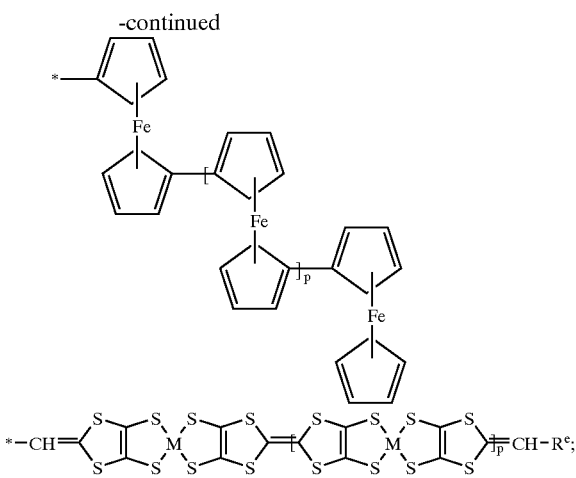

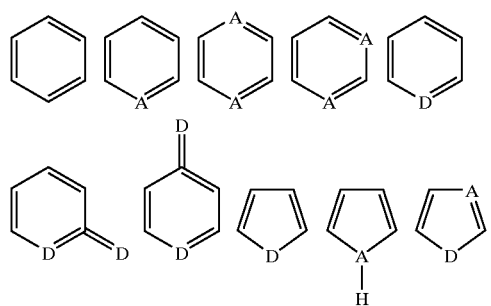

M representing a divalent metal;

o representing an integer from 0 to 6;

p denoting an integer from 1 to 20;

q representing 0 to 1;

Sp representing a π-conjugated spacer;

$R^3$ representing H or an alkyl group having 1 to 10 carbon atoms;

$R^e$ representing a terminal substituent which may be H or $R^s$;

one or more of the hydrogen atoms of $S^m$ being substituted by $R^s$; and $R^s$ representing —$OR^3$, —$C(O)R^3$, —$C(O)OR^3$, —$NR^3{}_2$, —$SR^3$, —$SO_3R^3$, —$PO_4R^3$, —$PR^3{}_2$, —CN, —OCN, —NCO, —$NO_2$, —($PPh_2Ru(CO)(C_5H_5)$), and an alkyl group having 1 to 10 carbon atoms, a cycloalkyl group having 5 to 20 carbon atoms, an aryl group having 6 to 20 carbon atoms, a heteroaryl group having 3 to 20 carbon atoms and 1 to 4 hetero atoms which are selected from the group consisting of O, S, and N, wherein these groups may be bonded via a single bond, an ethynyl group, —O—, —NH— or —S— to $S^m$, and the cycloalkyl, the aryl and the heteroaryl groups may be fused with $S^m$ via a common pair of carbon atoms;

Ar representing a fused-on aromatic or heteroaromatic radical that shares a carbon bond with the phenylene groups of the backbone of the polymer and thus forms with them a common π-electron system;

Ar being selected from the group consisting of

-continued

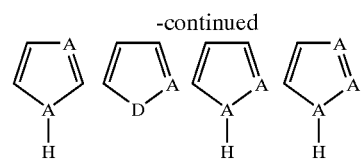

wherein each case two neighboring carbon atoms form a linkage point for the condensation with the phenylene groups in the polymer backbone;

A representing N, P, As, or Sb; and

D representing O, S, Se, or Te;

$R''$ represents any desired radical by which Ar can be substituted;

wherein a plurality of radicals $R''$, which may be identical or different, may be bonded to Ar, and the radicals $R''$ may be bonded to one another under formation of a conjugated π system; and n represents an integer from 1 to $10^6$;

$R''$ represents a monovalent radical selected from the group consisting of H, F, Cl, Br, alkyl groups having 1 to 10 carbon atoms, cycloalkyl groups having 5 to 20 carbon atoms, aryl groups having 6 to 20 carbon atoms, in which up to four carbon atoms may be replaced by N,

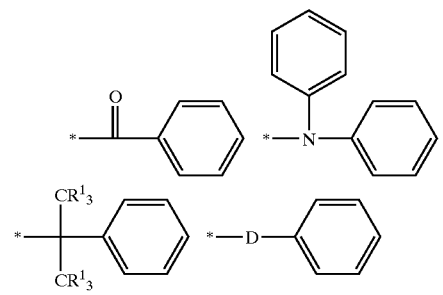

where $R^1$ represents H, F, Cl, or Br;

D represents O, S, Se, or Te; and

* designates a linkage point to Ar or a further radical; and wherein these groups may also be linked to Ar by an ethynyl group;

or representing a fused-on radical selected from the group consisting of

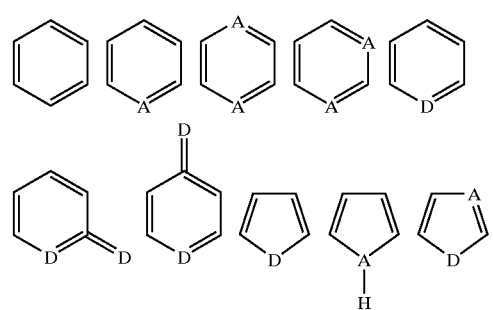

-continued

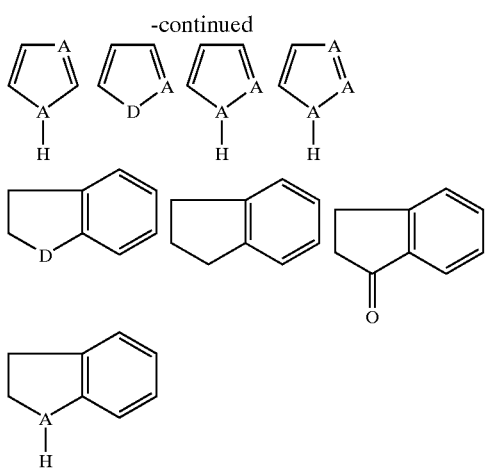

which in turn may be fused to one another with formation of a polycyclic π-system; and wherein A represents N, P, As, or Sb, D represents O, S, Se, or Te, and the linkage to Ar is effected via neighboring carbon atoms such that an extensive π system is formed; and when Ar is selected to be phenyl and $S^m$ is selected to be

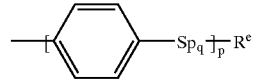

q is 1;

p is from 1 to 20; and $R^e$ represents a terminal substituent that may be H or $R^s$.

* * * * *